United States Patent [19]

Bottomley

[11] Patent Number: 4,480,228

[45] Date of Patent: Oct. 30, 1984

[54] SELECTIVE VOLUME METHOD FOR PERFORMING LOCALIZED NMR SPECTROSCOPY

[75] Inventor: Paul A. Bottomley, Clifton Park, N.Y.

[73] Assignee: General Electric Company, Schenectady, N.Y.

[21] Appl. No.: 434,688

[22] Filed: Oct. 15, 1982

[51] Int. Cl.$^3$ ............................................. G01R 33/08
[52] U.S. Cl. ..................................... 324/309; 324/307
[58] Field of Search .............. 324/300, 307, 311, 309, 324/318

[56] References Cited

U.S. PATENT DOCUMENTS 4,318,043  3/1982  Crooks et al. ........................ 324/309

OTHER PUBLICATIONS

Application S.N. 394,355, P.A. Bottomley et al., Group Art Unit 212, Filed Jul. 1, 1982.

Primary Examiner—Michael J. Tokar
Attorney, Agent, or Firm—Marvin Snyder; James C. Davis, Jr.

[57] ABSTRACT

Selective irradiation is used to isolate a planar slice of nuclear spins in a nuclear magnetic resonance (NMR) sample. Selective radio frequecy pulses, applied in the presence of magnetic field gradients, are then employed to define a smaller sensitive volume in a predetermined region of the isolated planar slice. An NMR spin echo signal produced by excited nuclear spins situated in the thusly localized volume is observed in the absence of magnetic field gradients and, upon Fourier transformation, yields the desired localized chemical shift spectra.

23 Claims, 11 Drawing Figures

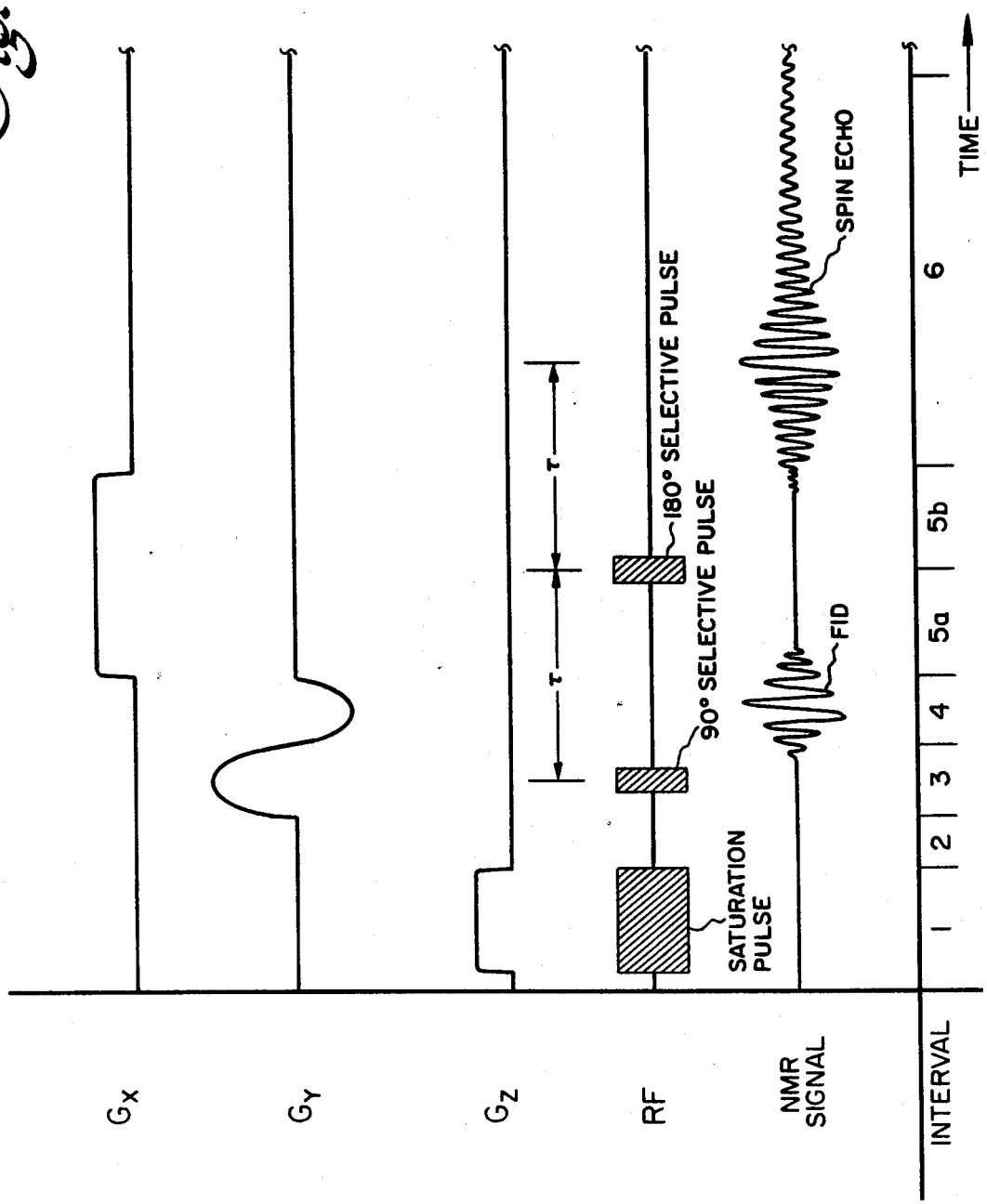

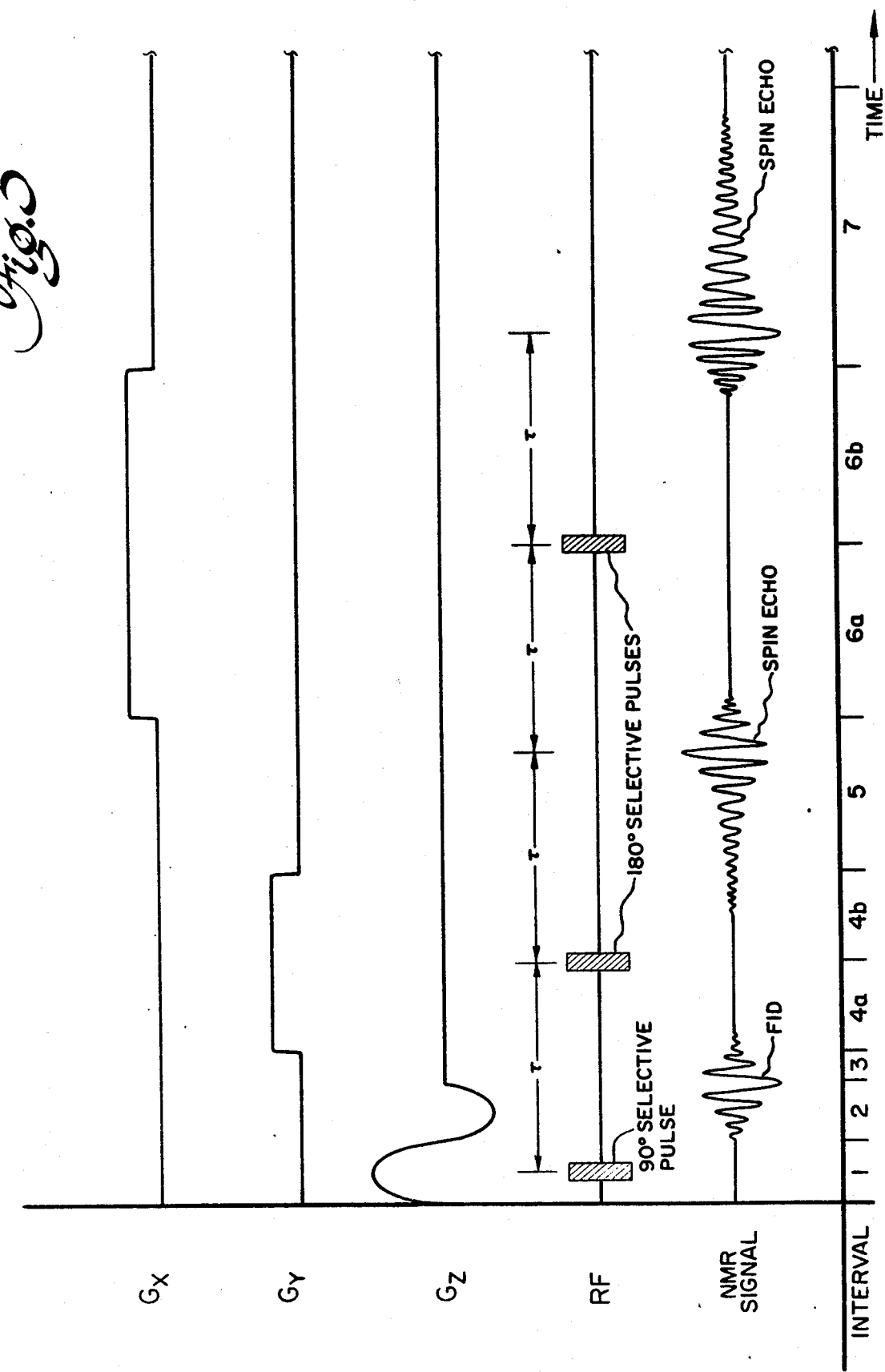

SELECTIVE VOLUME METHOD FOR PERFORMING LOCALIZED NMR SPECTROSCOPY

BACKGROUND OF THE INVENTION

This invention relates to spectroscopic methods using nuclear magnetic resonance (NMR). More specifically, the invention relates to methods for performing spatially localized NMR chemical shift spectroscopy.

Atomic nuclei having net magnetic moments placed in a static magnetic field, $B_o$, oscillate or precess about the axis of field $B_o$ at an NMR (Larmor) frequency $\omega$ given by the equation $$\omega = \gamma B_o \qquad (1)$$

in which $\gamma$ is the gyro-magnetic ratio (constant for each NMR isotope). The frequency at which the nuclei precess is thus primarily dependent on the strength of the magnetic field and $B_o$, and increases with increasing field strength. Chemical shifts occur where the NMR frequency of resonant nuclei of the same type in a given molecule differ because of different magnetic environments produced by differences in their chemical environment. For example, electrons partially screen the nucleus from the magnetic field and thereby affect its resonant frequency. The degree of shielding caused by the electrons depends on the environment of the nucleus, and thus the chemical shift spectrum of a given molecule is unique and can be used for identification. Because the resonant frequency, hence the absolute chemical shift, is dependent on the strength of the applied field, the chemical shift spectrum is expressed as fractional shift in parts-per-million (ppm) of the NMR frequency relative to an arbitrary reference compound. By way of illustration, the range of chemical shifts is about 10 ppm for protons ($^1H$), 30 ppm for phosphorus ($^{31}P$), and 200 ppm for carbon ($^{13}C$). In order to discern such small chemical shifts, the homogeneity of field $B_o$ must exceed the differences in chemical shifts of the peaks in the spectrum and typically is much better than 1 part in $10^6$ (1 ppm).

In conventional NMR spectroscopy, chemically shifted signals are observed from the whole of the NMR sample placed in the region to which the NMR coil is sensitive. While this is satisfactory for studying the chemical structure of a homogeneous sample, to enable discrimination of normal and abnormal conditions in biological or medical diagnostic applications, it is necessary to spatially discriminate the signal components. For instance, phosphorus exists in the body attached to key molecules involved in metabolism. The localized measurement of the amplitudes of the phosphorus spectral lines could provide a direct and unique measure of cellular energy and of the state of health of the tissue in the region examined.

In the past, surface coil, topical, and sensitive point NMR methods have been used to perform localized chemical shift spectroscopy. All of these techniques have limitations. In surface coil spectroscopy, a flat NMR receiver/transmitter coil is positioned over the sample region of interest. The spatial selectivity of the surface coil is, however, limited to substantially a volume subtended by the coil circumference and one radius deep from the coil center. Some variation in depth is possible by changing the NMR pulse lengths, but scanning typically requires manually moving the coil and re-tuning it. Additionally, the size of the sensitive region is limited by the coil diameter and unwanted contributions to the NMR signal from the coil leads. In topical NMR, magnetic field gradients are applied to generate a field that is homogeneous only over a small fixed volume centered on the region of interest. Since the NMR signal is observed in the presence of a gradient magnetic field, some broadening, and consequent loss of spectral resolution, of the spectra occurs. Other regions of interest may be scanned by moving the sample through the volume, a less than convenient or efficient expedient. Spatial localization in the sensitive point method is achieved by application of three orthogonal, time-dependent linear gradient magnetic fields in the presence of a continuous sequence of closely spaced phase-alternated radio frequency (RF) excitation pulses. The time-dependent NMR signal component originating outside the sensitive point is removed by a low-pass filter, leaving the time-independent signal originating only from the sensitive point. This signal is Fourier transformed with respect to the data acquisition time to yield the chemical shift spectrum. The sensitive point is scanned across a sample by changing the ratio of currents in the appropriate gradient coil set. An objectionable feature of this method is the conflicting requirement for time-dependent fields outside the volume of interest, while a homogeneous, time-independent field is required within the sensitive volume. Under these conditions, the spectra from the sensitive volume are artificially broadened and contain sideband-type artifacts which again deleteriously reduce spectral resolution.

Accordingly, it is an object of the invention to provide improved methods for performing localized spectroscopy in which the sensitive volume is selected electronically without moving parts or gantries and which minimize spectral distortion.

It is another object of the invention to provide improved localized spectroscopy methods in which the range of positions of the sensitive volume is selectable without restriction.

It is still another object of the invention to provide improved localized NMR spectroscopy methods in which the NMR signal or the free induction decay (FID) is observed in the absence of magnetic field gradients used for spatial localizaton, thereby avoiding spectral line broadening and loss of spectral resolution.

SUMMARY OF THE INVENTION

Localized NMR chemical shift spectroscopy is performed by using selective irradiation to first isolate a plane of nuclear spins in an NMR sample situated in a homogeneous magnetic field. Thereafter, RF excitation pulses are applied in the presence of magnetic field gradients to further localize the NMR signal to a sensitive volume within the plane. The NMR signal from the sensitive volume is sensed in the absence of magnetic field gradients and upon Fourier transformation yields localized chemical shift spectra.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIG. 2 depicts an NMR pulse sequence of the invention in which a selective saturation pulse is employed to define a planar volume;

FIG. 3 depicts another NMR pulse sequence of the invention in which a selective 90° RF pulse is used to define a planar volume;

DETAILED DESCRIPTION OF THE INVENTION

Figure 1A:
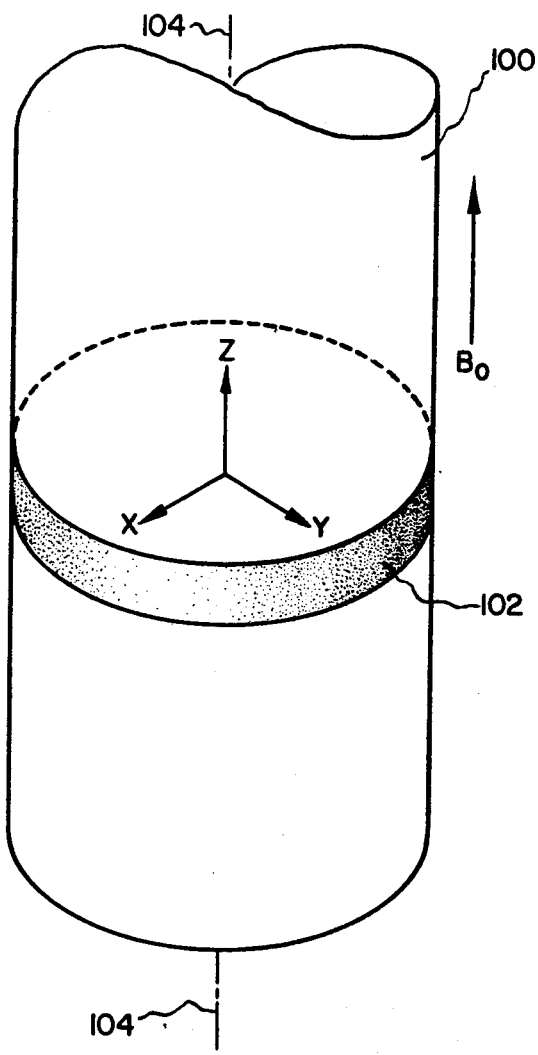
FIG. 1a illustrates an NMR sample situated in a static magnetic field and having a planar volume defined therein by selective irradiation.
Figure 1B:
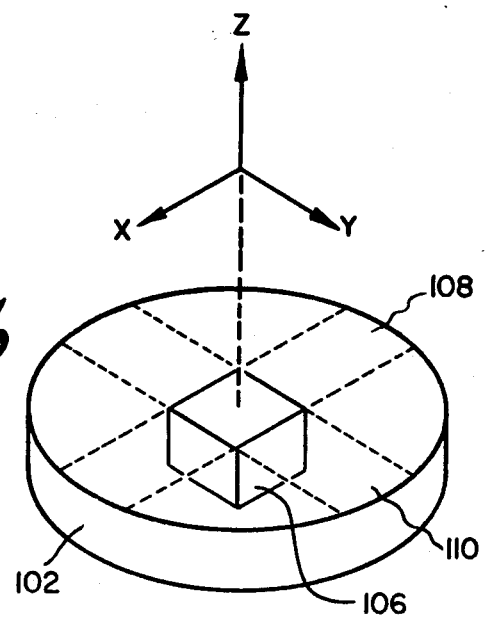
FIG. 1b depicts a planar volume having a sensitive volume localized therein using the inventive pulse sequence of FIG. 2.
Figure 1C:
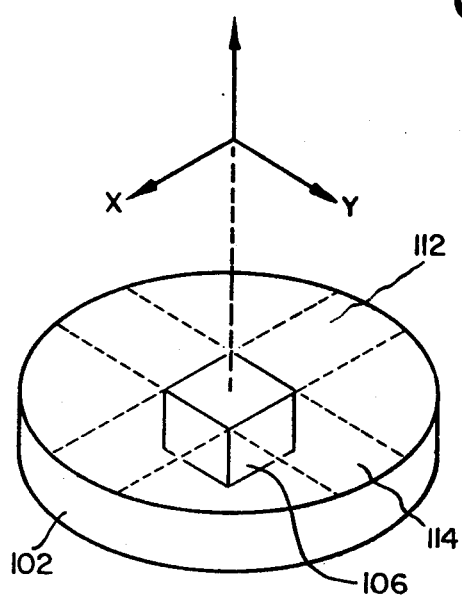
FIG. 1c is similar to FIG. 1b, but illustrates a sensitive volume selected using the inventive pulse sequence of FIG. 3.

The inventive NMR pulse sequences depicted in FIGS. 2 and 3 will be best understood if initial reference is made to FIGS. 1a, 1b, and 1c. FIG. 1a depicts an NMR sample 100 situated in a static homogeneous magnetic field $B_o$ directed in the positive Z-axis direction of the Cartesian coordinate system. The Z-axis is selected to be coincident with the long or cylindrical axis 104 of sample 100. The origin of the coordinate system is taken to be the center of the sample, which is also at the center of a planar slice 102 selected by the principle of selective irradiation in the presence of magnetic field gradients, as will be described hereinafter. FIGS. 1b and 1c each depict a slice 102 having defined therein a sensitive volume 106 localized by the use of the inventive pulse sequences of FIGS. 2 and 3, respectively, which will be described hereinafter. It is from sensitive volume 106 that the desired NMR signal containing the sought spectroscopic information originates.

It is further beneficial to the understanding of the invention to observe that in each pulse sequence the NMR sample is positioned in a static field $B_o$ which is accordingly omitted from the figures depicting NMR pulse sequences.

In addition, in each pulse sequence magnetic field gradients are necessary to produce spatial localization of the NMR signal to that originating in volume 106 of FIGS. 1b and 1c. Typically, three such gradients are necessary:

$$G_x(t) = \partial B_o / \partial x \qquad (2)$$

$$G_y(t) = \partial B_o / \partial y \qquad (3)$$

$$G_z(t) = \partial B_o / \partial z \qquad (4)$$

The $G_x$, $G_y$, and $G_z$ gradients are constant throughout volume 100, but their magnitudes are typically time dependent. The magnetic fields associated with the gradients are denoted, respectively, $b_x$, $b_y$, and $b_z$, wherein $$b_x = G_x(t)x \qquad (5)$$

$$b_y = G_y(t)y \qquad (6)$$

$$b_z = G_z(t)z \qquad (7)$$

within the volume.

RF magnetic field pulses are directed orthogonal to the $B_o$ field and are used along with magnetic field gradients to excite specific nuclear spins to resonance. The frequency of the RF pulse needed to induce resonance is the same as the Larmor frequency defined by equation (1). Two types of RF magnetic field pulses commonly used are 90° and 180° pulses. A 90° RF pulse causes nuclear magnetic moments to rotate 90° about the axis defined by the applied RF magnetic field vector in a Cartesian coordinate frame of reference rotating at the resonant frequency about the direction of field $B_o$, relative to the laboratory frame of reference. The rotating Cartesian coordinate frame is denoted by primes X', Y', Z', the Z'-axis being coincident with the Z-axis in the laboratory frame of reference. Thus, if the direction of field $B_0$ is assumed to be the positive Z-axis direction of the laboratory Cartesian Coordinate system, a 90° RF pulse will cause nuclear magnetization along $B_o$ to rotate into the transverse plane defined by the X'- and Y'-axis, for example. Similarly, a 180° RF pulse causes nuclear magnetization along $B_o$ to rotate 180° about the axis of field $B_o$ (e.g., from the positive Z'-axis direction to the negative Z'-axis direction).

It should be further noted that RF pulses may be selective or nonselective. Selective pulses are typically modulated to have a predetermined frequency content so as to excite nuclear spins situated in preselected regions of the sample having magnetic field strengths as defined by equation (1). The selective pulses are applied in the presence of the localizing magnetic field gradients. Nonselective pulses generally affect all of the nuclear spins situated within the field of the RF pulse transmitter coil and are typically applied in the absence of the localizing magnetic field gradients.

Reference is now made to FIG. 2 which depicts one embodiment of an NMR pulse sequence for performing localized NMR spectroscopy. In interval 1, shown along the horizontal axis of FIG. 2, planar volume 102 (FIG. 1a) is isolated perpendicular to the Z-axis by selective saturation of nuclear spins in the regions of the sample outside volume 102. This is accomplished by means of a selective saturation pulse, which is a long, powerful, tailored RF pulse of duration approximately equal to the sample spin lattice relaxation time ($T_1$) and with frequency components chosen to irradiate the entire sample 100 (FIG. 1a), except the chosen plane 102. The selective saturation pulse is applied in the presence of a pulsed gradient magnetic field $G_z$, shown along the vertical axis of FIG. 2, directed in the Z-axis direction. The use of such a selective irradiation pulse in an NMR imaging context is disclosed by A. N. Garroway, et al. in *Solid State Physics*, Vol. 7, L457 (1974). An alternative (not shown) to selective saturation which will produce the same effect in this pulse sequence is to use in interval 1 a selective 90° RF pulse with frequency components chosen to irradiate the entire sample 100 (FIG. 1a), except the chosen volume 102 in the presence of a pulsed magnetic field gradient $G_z$. In this alternative, $G_z$ is left on for several milliseconds after the 90° pulse ends in order to rapidly dephase and destroy the NMR signal originating outside planar volume 102.

In interval 3, following a wait in interval 2 of approximately a millisecond or longer to allow gradient pulse currents to subside, a 90° selective excitation pulse is applied in the presence of a positive $G_y$ gradient directed in the positive Y-axis direction so as to excite a strip 108 of nuclear spins perpendicular to the Y-axis, as shown in FIG. 1b. This is immediately followed in interval 4 with the application of a negative $G_y$ gradient pulse with an integral with respect to time (over interval 4) equal to one half the integral (over interval 3) of the positive $G_y$ gradient to rephase the nuclear spins dephased by the G gradient in interval 3. The rephasing effect may be observed by the increase in signal amplitude in the free induction decay (FID) NMR signal depicted in interval 4. This NMR signal originates from the entire line of spins excited by the 90° RF pulse and is normally not observed.

During intervals 5a and 5b, a $G_x$ gradient, directed in the positive X-axis direction, is applied and is selected such that the integral with respect to time of the gradient waveform over interval 5a is equal to the integral of the gradient waveform over interval 5b to ensure proper timing of the spin-echo signals. At a time $\tau$ following the mean application of the 90° RF pulse in inteval 3, a selective ½° RF pulse is applied so as to selectively invert nuclear spins at a preselected volume 106 along strip 110. In this manner, the NMR signal from volume 106 alone can be observed as a spin echo in interval 6 at a time $\tau$ following the mean application of the selective 180° RF pulse. The $G_x$ gradient is left on continuously in intervals 5a and 5b to rapidly dephase the NMR signal from nuclear spins situated along line 108 outside volume 106 to avoid the interference thereof with the desired spin echo signal. Additionally, the $G_x$ gradient in intervals 5a and 5b acts to reduce the effects of any spurious FID NMR signals on the desired spin echo due to imperfect 180° RF pulses, as disclosed and claimed in U.S. application Ser. No. 394,355, filed July 1, 1982, and assigned to the same assignee as the present invention.

The Fourier transformation of the spin echo signal observed in interval 6 in the absence of gradients yields the chemical shift spectrum of the chemical species situated in the selected sensitive volume. It should be noted that the spin echo signal must be observed in the absence of magnetic field gradients used for spatial localization. This is due to the fact that the effect of magnetic field gradients and chemical shifts on the NMR signal is similar and cannot be distinguished without prior knowledge of either spatial structure or chemical shift, contrary to the object of the invention (i.e., obtain chemical shift spectra) from a selected volume.

The pulse sequence depicted in FIG. 2 is repeated with a repetition period comparable to the $T_1$ of sample 100 in the selected volume 106, and successive spin echo signals are averaged until the desired signal-to-noise ratio is achieved. The $T_1$ relaxation period for biological tissue is frequency dependent and is on the order of about 100 milliseconds to 3 seconds at the frequencies (e.g., 60 MHz) used in NMR spectroscopy but, typically, is less than 1 second. The interval is chosen so that the period (interval 6) of data acquisition occurs in a time period after the saturating pulse that is short compared to $T_1$ of the sample in order to minimize the possibility of an NMR signal from outside the selected planar volume 102 contributing to the observed signal (i.e., $2\tau < T_1$).

The efficiency of the spectroscopic data collection process may be improved by observing the spectra from other selected volumes following a single saturation sequence comprising the steps depicted in intervals 1–4 of FIG. 2. This is accomplished, following one observation of the spin echo in interval 6, by changing the frequency content of the 180° pulse in intervals 5a and 5b to select a different sensitive volume 106. This process can be repeated until the $T_1$ relaxation process becomes so advanced that planar volume 102 (FIG. 1a) defined by selective saturation loses definition.

Preferably, the location of sensitive volume 106 (FIG. 1b) may be advanced to another location by changing the RF frequency of the 90° and 180° RF pulses in subsequent applications of the pulse sequence. Alternatively, scanning can be achieved by changing the ratio of currents in each half of a gradient coil pair (described hereinafter) generating the gradient orthogonal to the desired scanning direction. This method may be best understood if it is considered that a gradient coil pair produces a magnetic field which increases linearly (as noted earlier) from some negative value of magnetic field near one of the coil halves forming the gradient coil pair to some positive value close to the other coil half. When currents in each coil half are equal, the point at which the magnetic field has zero value is at the midpoint between the coils providing, of course, that each coil half is wound identically. The effect of increasing the current in one of the coil halves and decreasing it in the other is to shift the point at which the magnetic field has a value of zero closer to the coil half with the lower current, thereby shifting the position of the sensitive volume when the frequency content of the RF pulses is kept unchanged. It should be noted that the point of the magnetic field gradient having a value of zero corresponds to the resonant frequency of the RF pulses, as predicted by equation (1), so that the pulses affect nuclear spins situated in the vicinity thereof. A third, less desirable, alternative is to scan by moving NMR sample 100 relative to the localized sensitive volume.

The amplitudes of the observed spectra are $T_2$ (spin-spin relaxation time) dependent. Different $T_2$ components can be selected by varying interval $\tau$ between the mean application of the 90° and 180° RF pulses, providing $2\tau < T_1$ as noted above. As the length of interval $\tau$ is increased, the amplitude of each component of the spectrum decays with an exponential dependence according to its $T_2$ time. Thus, $T_2$ is calculated for each peak in the spectrum by recording several spectra with different values and plotting the height of each peak versus on a logarithmic graph.

FIG. 3 illustrates another NMR pulse sequence for performing localized NMR spectroscopy which may be best appreciated if reference is also made to FIGS. 1a and 1c.

In interval 1 of FIG. 3, a planar volume 102 (FIG. 1a) perpendicular to the Z-axis is selected by the application of a selective 90° RF pulse in the presence of a positive $G_z$ gradient. The application of the 90° RF pulse is followed in interval 2 by the application of a reversed $G_z$ gradient pulse to rephase the nuclear spins as previously described with reference to the reversed $G_y$ gradient in interval 4 of FIG. 2. Following a short wait of about a millisecond in interval 3 to allow currents to subside in the $G_z$ gradient coils, a G gradient is applied in intervals 4a and 4b to rapidly dephase and therefore destroy the FID signal (intervals 2 and 3) generated by the 90° RF pulse. This FID is produced by spins situated solely in selected plane 102. At approximately the endpoint of interval 4a, while gradient $G_y$ is on, a selective 180° RF pulse is applied to invert nuclear spins lying in a chosen line 112 (FIG. 1c) within the selected plane 102 perpendicular to the Y-axis. The location of line 112 within the plane is determined by the RF frequency content of the 180° pulse.

The effect of inverting nuclear spins along line 112 is to generate a spin echo signal in interval 5 at a time interval $\tau$ following the 180° pulse in intervals 4a and 4b. Interval $\tau$ is substantially equal to the interval between the mean application of the 90° and the 180° pulses. The spin echo signal derives from the entire line 112 within the plane and dephases rapidly in the presence of the $G_x$ gradient which is applied in intervals 6a and 6b. The Fourier transform of the signal in interval 6a, incidentally, gives the nuclear spin density distribution along the entire line 112.

Following the decay of the spin echo occurring in interval 5, with $G_x$ gradient still on, a second selective 180° RF pulse is applied at a time $3\tau$ following mean application of the 90° pulse so as to invert all nuclear spins along a line 114 (FIG. 1c) perpendicular to the X-axis. This second inversion generates two more spin echo signals. The first of these occurs at a time $4\tau$ after the 90° pulse and has its first half attenuated by the $G_x$ gradient as shown in interval 6b of FIG. 3. The NMR signal in this spin echo derives from all spins lying in a sensitive volume 106 (FIG. 1c) at a point of intersection of the chosen lines 112 and 114 in selected plane 102. Fourier transformation of the unattenuated portion of this spin echo signal occurring in interval 7, in the absence of gradients, yields the chemical shift spectrum at selected point 106 as required.

The second spin echo (not shown) occurs at a period greater than or equal to $3\tau$ after the 180° pulse in intervals 6a and 6b, where $3\tau$ is also the delay between the 90° pulse (interval 1) and this 180° pulse. The actual occurrence of this spin echo signal depends on the accumulated accelerated dephasing that occurs in the intervening period between the 90° pulse and the last 180° pulse (intervals 6a and 6b) due to the $G_y$ and $G_x$ gradients. This spin echo signal is derived from spins lying along line 114 minus those that intersect line 112 at the selected sensitive volume 106. The spin echo is not normally recorded but could be used to obtain imaging information.

As with the method shown in FIG. 2, the purpose of leaving the $G_y$ gradient on for an extended period in intervals 4a and 4b of FIG. 3 and the $G_x$ gradient on for an extended period in intervals 6a and 6b of FIG. 3 is to ensure proper spin echo timing, to rapidly dephase the NMR signal from nuclear spins situated outside the selected volume 106 to avoid interference thereof with the desired spin echo signal, and to reduce the effects of any spurious FID component on the observed spin echo signal due to imperfect 180° RF pulses. The $G_x$ and $G_y$ gradients are symmetric in time with respect to the $\frac{1}{2}°$ pulses applied at the respective midpoints thereof. That is, the integrals with respect to time of the waveforms of each of gradients $G_y$ and $G_x$ over intervals 4a and 6a, respectively, are selected to be equal to the integrals with respect to time of the waveforms of the two gradients over intervals 4b and 6b, respectively.

When adjusting the timing parameters, the time interval $3\tau$ between the 90° pulse interval 1 (FIG. 3) and the 180° pulse in intervals 6a and 6b must be such that the second spin echo (described above) occurs sufficiently long after the spin echo in interval 7, bearing the chemical shift information, that it does not overlap with the period (typically 50 to 100 milliseconds) during which data is collected. In practice this is assisted by the absence of a $G_y$ gradient pulse after the last 180° RF pulse in intervals 6a and 6b which ensures that the amount of dephasing that occurs in the $3\tau$ interval prior to the last RF pulse is greater than the rephasing that occurs in the $3\tau$ interval after the last pulse, thereby postponing the occurrence of the second spin echo signal.

As with the pulse sequence of FIG. 2, the spectra obtained by Fourier transformation of the spin echo signal in interval 7 can additionally provide $T_2$ information or be made $T_2$-dependent by varying interval $\tau$ (FIG. 3).

$T_1$ information may be obtained by the known inversion/recovery method in which the pulse sequence of FIG. 3 is preceded with a nonselective 180° RF pulse or an adiabatic fast passage.

The location of sensitive volume 106 (FIG. 1c) may be advanced by methods substantially identical to those discussed hereinbefore with reference to FIG. 1b.

In FIGS. 2 and 3, the selective 90° and 180° RF pulses are schematically depicted as shaded rectangles. In practice, they may be Gaussian or $\sin(bt)/(bt)$, wherein b is a constant and t is time, amplitude modulated RF pulses having an RF frequency corresponding to the Larmor frequency of nuclear spins in the desired region of the NMR sample in the presence of the gradients.

The spectral bandwidth of the selective excitation pulses must be chosen sufficiently wide to excite the chemical shift spectrum of all of the chemical species of interest. Thus, for example, if selective pulses with too narrow a frequency bandwidth were used to study phosphorus chemical shift spectra showing metabolism in muscle, only a single specie (such as phosphocreatine) might be observed, whereas other species, such as adenosine triphosphate, adenosine diphosphate, inorganic phosphate, and sugar phosphates, may also be of interest.

Frequently, portions of the NMR sample located at the edge of the sensitive volume contain chemical species whose chemical shifts are such that they lie outside the range of frequencies excited by the selective pulses. Such chemical species will not contribute to the observed spectrum, whereas other species at the same location will provide a contribution, thus distorting the resulting spectrum. This undesirable effect may be minimized by reducing the relative contribution to the NMR spectrum from the edge spins. This may be accomplished by sharpening the excitation profile of the selective pulses so that sensitive volume 106 (FIGS. 1b and 1c) has sharply defined boundaries. To this end, the RF pulses may be preferably modulated by a signal of waveform $\sin(bt)/(bt)$ which has a rectangular-shaped excitation profile.

Additional distortion of the spectra will occur if Gaussian-shaped RF pulses are used due to the rounded shape of the excitation frequency profile. In this case, when using 180° pulses, portions of the sensitive volume and adjacent regions actually receive excitation having a 90° component such that spurious NMR signals are produced. Relief from the spurious FID is gained by using extended $G_x$ and $G_y$ pulses as noted. However, care must be taken to ensure that the range of spectral frequencies to be observed is well within the FWHM (full width half maximum) of the excitation profile. Some correction of the edge distortion is obtained by multiplication by an inverse function of the excitation profile function.

Although gradients $G_y$ in intervals 3 and 4 (FIG. 2) and $G_z$ in intervals 1 and 2 (FIG. 3) have been illustrated as positive and negative half-sinusoids, they may assume other configurations, such as Gaussian or rectangular. In the preferred embodiments, the integral with respect to time of the respective positive gradient pulse waveforms is selected to be substantially equal to twice the integral with respect to time of the respective negative gradient pulse waveforms.

Figure 4:
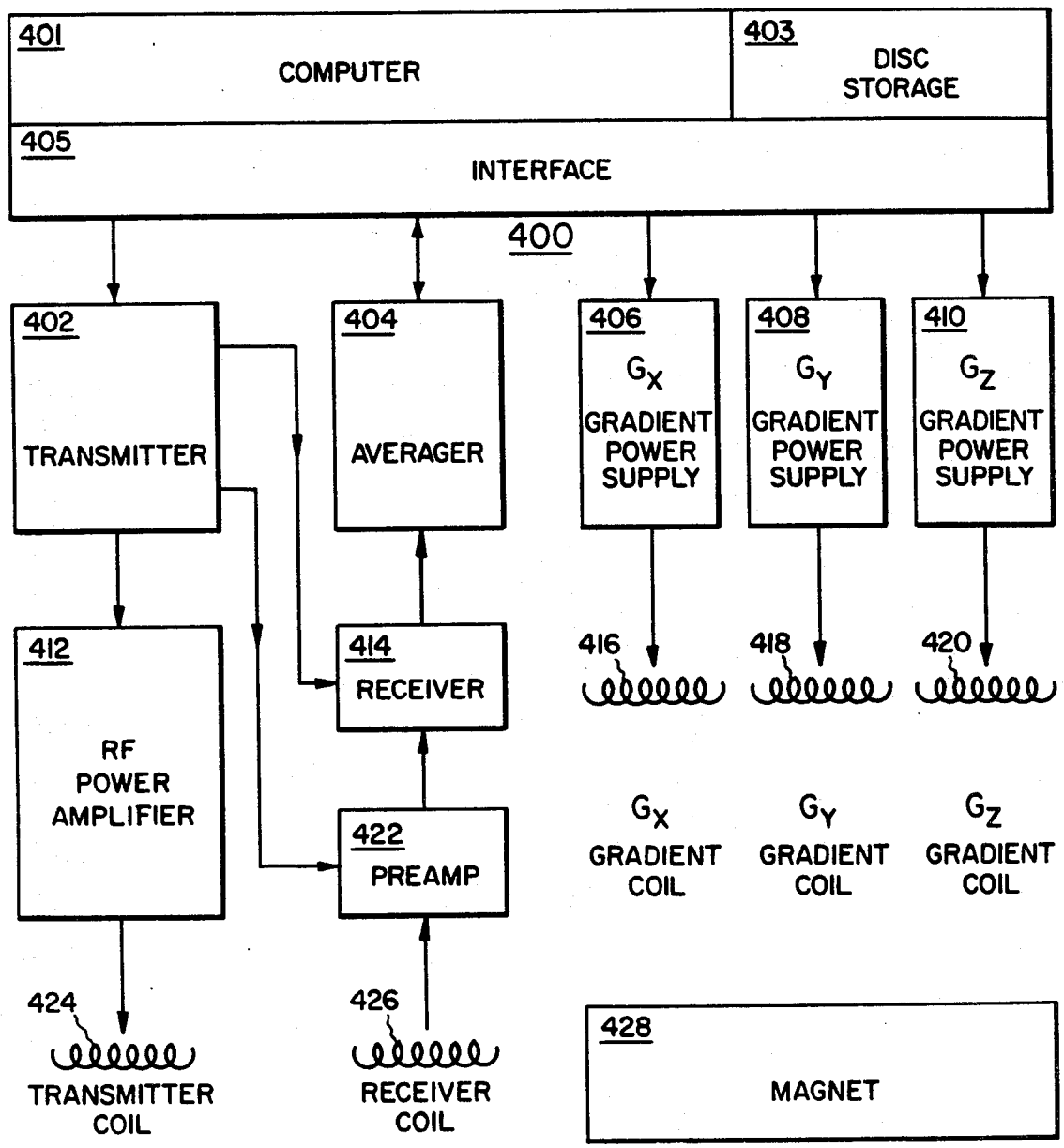
FIG. 4 illustrates a simplified block diagram of the major components of an NMR imaging apparatus suitable for producing the NMR pulse sequences shown in FIGS. 2 and 3.

FIG. 4 is a simplified block diagram of the major components of an NMR system suitable for use with the NMR pulse sequences of the invention described herein. The system, generally designated 400, is made up of a general purpose minicomputer 401 which is functionally coupled to disk storage unit 403 and an interface unit 405. An RF transmitter 402, signal averager 404, and gradient power supplies 406, 408, and 410 for energizing, respectively, $G_x$, $G_y$, $G_z$ gradient coils 416, 418, and 420, are coupled to computer 401 through interface unit 405.

RF transmitter 402 contains an RF oscillator oscillating at the desired Larmor frequency. If the sensitive volume is scanned by varying the frequency of the RF pulse, this can be done automatically from the computer using a commercially available programmable frequency synthesizer. The transmitter is gated with pulse envelopes from computer 401 to generate RF pulses having the required modulation to excite resonance in the object under study. The RF pulses are amplified in RF power amplifier 412 to levels varying from 100 watts to several kilowatts, depending on the NMR method, and applied to transmitter coil 424. The higher power levels are necessary for large sample volumes, and where short duration pulses are required to excite large NMR frequency bandwidths.

The NMR signal is sensed by receiver coil 426, amplified in a low noise preamplifier 422, and applied for further amplification, detection, and filtering to receiver 414. The signal is then digitized for averaging by signal averager 404 and for processing by computer 401. Preamplifier 422 and receiver 414 are protected from the RF pulses during transmission by active gating or by passive filtering.

Computer 401 provides gating and envelope modulation for the NMR pulses, blanking for the preamplifier and RF power amplifier, and voltage waveforms for the gradient power supplies and advances the gradients and the frequency of RF pulses during scanning. The computer also performs data processing such as Fourier transforms, data filtering, and storage functions (all of which are operations conventionally performed by minicomputers and hence described only functionally, supra).

Figure 5A:
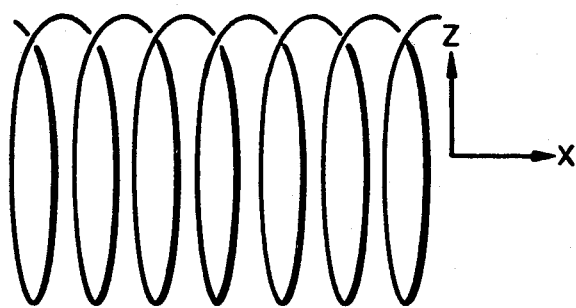
FIG. 5a illustrates an RF coil design for use with geometries for which the sample chamber is perpendicular to the static magnetic field.
Figure 5B:
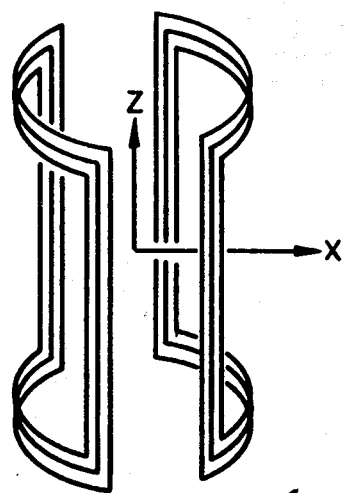
FIGS. 5b and 5c illustrate an RF coil design suitable for magnetic geometries for which the axis of the sample chamber is parallel to the static magnetic field.
Figure 5C:
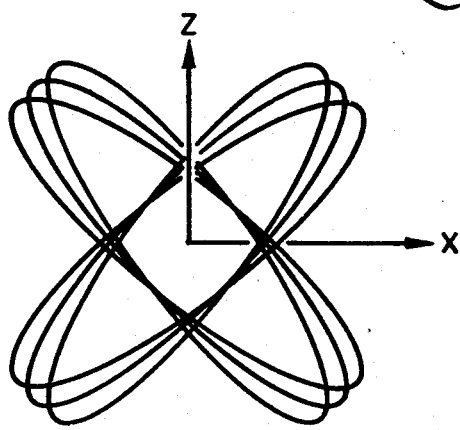

The transmitter and receiver RF coils, if desired, may comprise a single coil. Alternatively, two separate coils that are electrically orthogonal may be used. The latter configuration has the advantage of reduced RF pulse breakthrough into the receiver during pulse transmission. In both cases, the fields of coils are orthogonal to the direction of the static magnetic field $B_o$ produced by magnet 428 (FIG. 4). The coils are isolated from the remainder of the system by enclosure in an RF-shielded cage. Three typical RF coil designs are illustrated in FIGS. 5a, 5b, and 5c. All of these coils produce RF magnetic fields in the X-axis directon. The coil designs illustrated in FIGS. 5b and 5c are suitable for magnetic geometries for which the axis of the sample chamber is parallel to the main field $B_o$ (FIG. 1a). The design illustrated in FIG. 5a is applicable to geometries for which the sample chamber axis is perpendicular to the main field $B_o$ (not shown).

Magnetic field gradient coils 416, 418, and 420 (FIG. 4) are necessary to provide gradients $G_x$, $G_y$, and $G_z$, respectively. In the NMR pulse sequences described herein, the gradients should be monotonic and linear over the sample volume. Non-monotonic gradient fields cause a degradation in the NMR signal data, known as aliasing, which leads to severe artifacts. Non-linear gradients cause geometric distortions of the data.

Figure 6A:
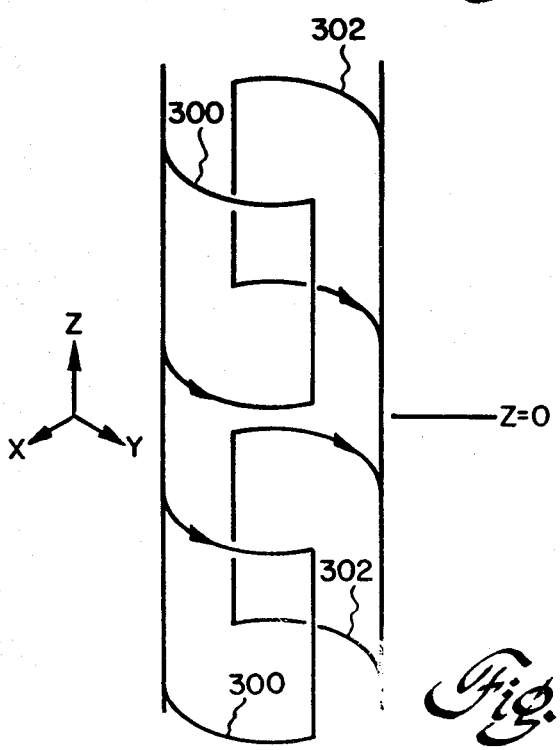
FIG. 6a illustrates a set of coils suitable for producing $G_x$ gradients.
Figure 6B:
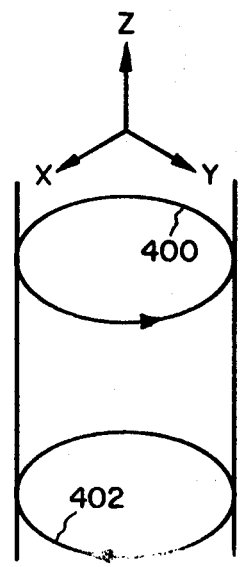
FIG. 6b depicts a coil configuration suitable for producing a $G_Z$ gradient.

A design for gradient coils suitable for magnet geometries with a sample chamber axis parallel to the main field $B_o$ is depicted in FIGS. 6a and 6b. Each of the gradients $G_x$ and $G_y$ is produced by a set of coils such as sets 300 and 302 depicted in FIG. 6a. The coil sets as illustrated in FIG. 6a produce gradient $G_x$. The coil sets for producing gradient $G_y$ are rotated 90° around the cylindrical axis 104 (FIG. 1a) of the sample chamber relative to the coil that produces gradient $G_x$. The $G_z$ gradient is generated by a coil pair such as coils 400 and 402 shown in FIG. 6b. If the sensitive volume is scanned by changing the ratio of currents in the gradient coils, each half, for example, 300 and 302 in FIG. 6a and 400 and 402 in FIG. 6b, can be driven by a separate power supply so that supplies 406, 408, 410 in FIG. 4 each may actually consist of two power supplies.

From the foregoing, it will be appreciated that, in accordance with the invention, methods are provided for performing localized NMR spectroscopy wherein the sensitive volume is selected electronically, and in which the range of sensitive volume positions is selectable without restriction, thereby avoiding spectral line broadening and loss of spatial resolution.

While this invention has been and is described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A method of performing localized NMR chemical shift spectroscopy comprising the steps of:
   (a) positioning an NMR sample in a homogeneous magnetic field directed along an axis thereof;
   (b) irradiating said NMR sample with a first RF pulse in the presence of a first magnetic field gradient so as to isolate a plurality of nuclear spins in a planar slice of said NMR sample;
   (c) applying a second RF pulse having a predetermined frequency content in the presence of a second magnetic field gradient so as to excite a fraction of said nuclear spins situated in a predetermined strip-like region of said planar slice oriented perpendicular to the direction of said second magnetic field gradient;
   (d) applying a third RF pulse having a predetermined frequency content in the presence of a third magnetic field gradient so as to invert nuclear spins in a predetermined volume of said strip-like region, said inverted nuclear spins producing a spin echo signal; and (e) sensing said spin echo signal in the absence of magnetic field gradients such that Fourier transformation of said spin echo signal yields a localized chemical shift spectrum from said predetermined volume.

2. The method of claim 1 further comprising the step of applying, following step (c), a magnetic field gradient having a direction opposed to the direction of said second magnetic field gradient and a fraction of the magnitude thereof so as to rephase said nuclear spins situated in said strip-like region.

3. The method of claim 2 wherein said first RF pulse comprises a frequency-tailored pulse having frequency components selected to irradiate said sample except in the region of said planar slice, and wherein the direction of said first magnetic field gradient is selected to be coincident with said sample axis.

4. The method of claim 3 wherein said second RF pulse comprises a selective 90° RF pulse and wherein the direction of said second magnetic field gradient is selected to have a direction orthogonal to said sample axis.

5. The method of claim 4 wherein said third RF pulse comprises a 180° selective pulse, and wherein said third magnetic field gradient is selected to have a direction orthogonal to the direction of said second magnetic field gradient and to said sample axis.

6. The method of claim 5 further comprising the steps of:
repeating the sequence of steps (a)–(e); and
varying in successive repetitions of steps (a)–(e) the interval between the application of said 90° pulse and said 180° pulse so as to produce a $T_2$ dependence in said chemical shift spectrum.

7. The method of claim 5 wherein said 90° and 180° pulses each comprise, respectively, an RF pulse amplitude modulated to have a Gaussian-shaped envelope.

8. The method of claim 5 wherein said 90° and 180° pulses each comprise, respectively, an RF pulse amplitude modulated by a signal of waveform $(\sin bt)/bt$, wherein $b$ is a constant and $t$ is time.

9. The method of claim 1, 7, or 8 further comprising the steps of:
changing the frequency content of at least one of said first and second RF pulses; and
repeating said steps (a)–(e) so as to obtain a spin echo signal produced by nuclear spins situated in a different predetermined volume.

10. The method of claim 1, 7, or 8 further comprising the steps of:
changing the ratio of currents in at least one coil of a coil pair producing at least one of said magnetic field gradients; and
repeating said steps (a)–(e), without altering the frequency of said RF pulses, so as to obtain a spin echo signal produced by nuclear spins situated in a different predetermined volume.

11. The method of claim 1, 7, or 8 further comprising the steps of:
changing the position of said NMR sample in said static magnetic field relative to the previous position thereof; and
repeating said steps (b)–(e), without altering said gradients and without altering the frequency of said RF pulses, so as to obtain a spin echo signal produced by nuclear spins situated in a different predetermined volume.

12. A method of performing localized NMR chemical shift spectroscopy comprising the steps of:
(a) positioning an NMR sample in a homogeneous magnetic field directed along an axis thereof;
(b) irradiating said NMR sample with a first RF pulse in the presence of a first magnetic field gradient so as to excite a plurality of nuclear spins in a planar slice of said NMR sample;
(c) applying a magnetic field gradient having a direction opposite to that of said first magnetic field gradient and a fraction of the magnitude thereof so as to rephase said plurality of nuclear spins;
(d) applying a second RF pulse in the presence of a second magnetic field gradient so as to invert a fraction of said nuclear spins situated in a first region of said planar slice oriented perpendicular to the direction of said second magnetic field gradient;
(e) applying a third RF pulse in the presence of a third magnetic field gradient so as to invert a plurality of nuclear spins situated in a second region of said planar slice oriented perpendicular to the direction of said third magnetic field gradient such that said first and second regions overlap forming a sensitized volume; and
(f) sensing in the absence of magnetic field gradients a spin echo signal produced by nuclear spins in said sensitized volume, wherein Fourier transformation of said spin echo signal yields a localized chemical shift spectrum from said sensitized volume.

13. The method of claim 12 wherein said first RF pulse comprises a selective 90° pulse and wherein the direction of said first magnetic field gradient is selected to be coincident with said sample axis.

14. The method of claim 13 wherein said second RF pulse comprises a first selective 180° pulse and wherein the direction of said second magnetic field gradient is selected to be orthogonal to the direction of said first magnetic field gradient.

15. The method of claim 14 wherein said third RF pulse comprises a second selective 180° RF pulse and wherein the direction of said third magnetic field gradient is selected to be orthogonal to the direction of said second magnetic field gradient and said sample axis.

16. The method of claim 15 where, in the repetitive application of steps (a)–(f), the interval between the application of said 90° pulse and said first 180° pulse is varied so as to produce a $T_2$ dependence in said chemical shift spectrum.

17. The method of claim 15 further comprising the step of applying in the repetitive application of steps (a)–(f) a non-selective 180° pulse at varying intervals prior to step (b) so as to produce a $T_1$ dependence in said chemical shift spectrum.

18. The method of claim 17 wherein said non-selective 180° RF pulse is replaced by an adiabatic fast passage.

19. The method of claim 15 wherein said 90° and 180° pulses each comprise, respectively, an RF pulse amplitude modulated to have a Gaussian-shaped envelope.

20. The method of claim 15 wherein said 90° and 180° pulses each comprise, respectively, an RF pulse amplitude modulated by a signal of waveform $(\sin bt)/bt$, wherein $b$ is a constant and $t$ is time.

21. The method of claim 12, 19, or 20 further comprising the steps of:

changing the frequency content of at least one of said first, second and third RF pulses; and repeating said steps (a)-(f) so as to obtain a spin echo signal produced by nuclear spins situated in a different sensitized volume.

22. The method of claim 12, 19, or 20 further comprising the steps of:

changing the position of said NMR sample in said static magnetic field relative to the previous position thereof; and repeating said steps (b)-(f), without altering said gradients and without altering the frequency of said RF pulses, so as to obtain a spin echo signal produced by nuclear spins situated in a different sensitized volume.

23. The method of claim 12, 19, or 20 further comprising the steps of:

changing the ratio of currents in at least one coil of a coil pair producing at least one of said magnetic field gradients; and repeating said steps (a)-(f), without altering the frequency of said RF pulses, so as to obtain a spin echo signal produced by nuclear spins situated in a different predetermined volume.

* * * * *